DIGITAL FREQUENCY SYNTHESIZER ELIMINATING HIGH SPEED COUNTERS
Filed Aug. 24, 1967
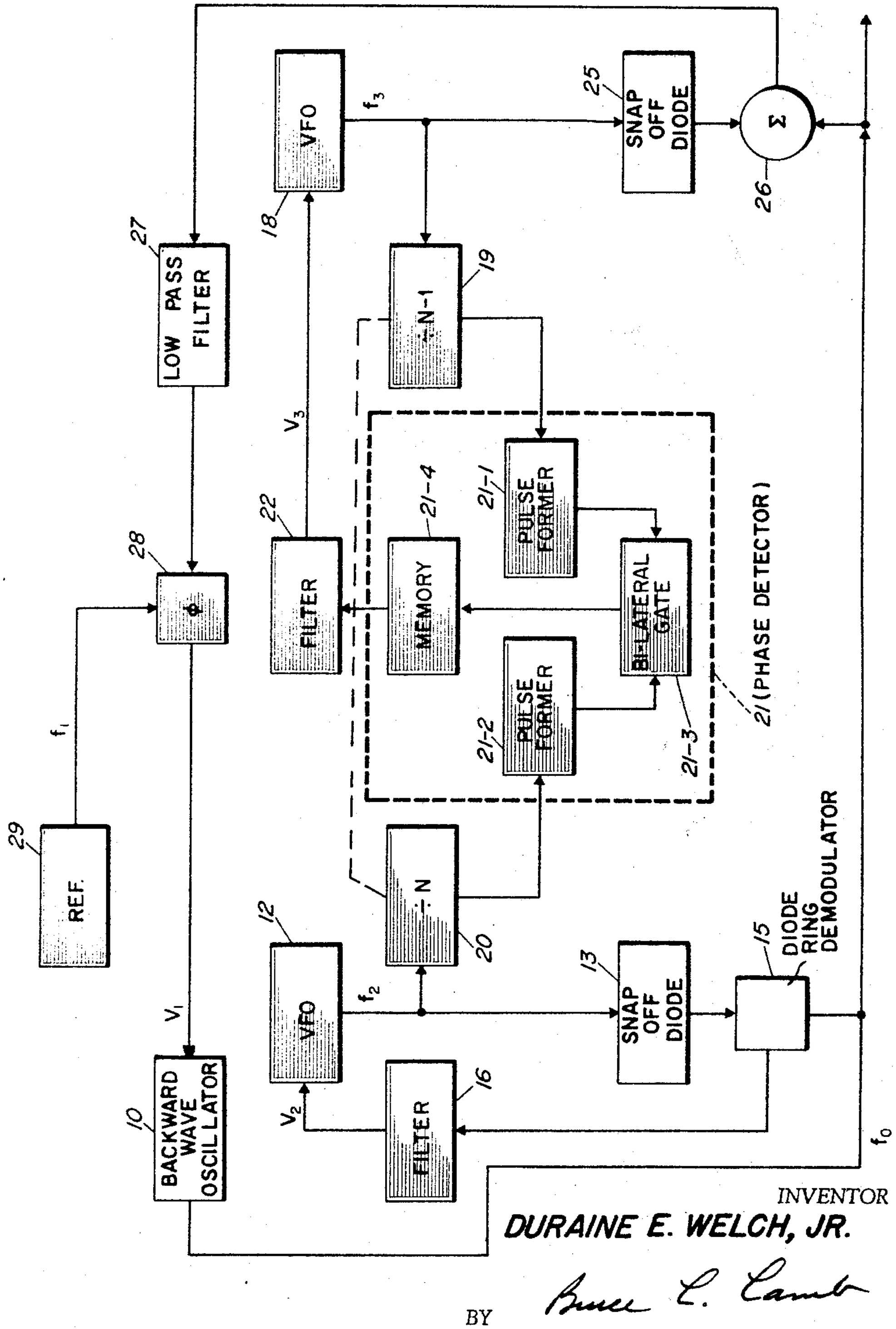
INVENTOR
DURAINE E. WELCH, JR.
BY Bruce L. Lamb
ATTORNEY

United States Patent Office 3,448,401 Patented June 3, 1969

3,448,401

DIGITAL FREQUENCY SYNTHESIZER ELIMINATING HIGH SPEED COUNTERS

Duraine E. Welch, Jr., Baltimore, Md., assignor to The Bendix Corporation, Baltimore, Md., a corporation of Delaware Filed Aug. 24, 1967, Ser. No. 662,991
Int. Cl. H03b 3/08
U.S. Cl. 331—2 20 Claims

ABSTRACT OF THE DISCLOSURE

A digitally controlled multichannel frequency synthesizer using a voltage controlled oscillator to generate coherent microwave frequencies. A second voltage controlled oscillator generates a second lower frequency in response to the generated microwave frequency and the $J^{th}$ harmonic of the second frequency. A third voltage controlled oscillator generates a third frequency which is related to the second frequency. The $K^{th}$ of the harmonic of the third frequency is mixed with the generated microwave frequency and compared to a reference frequency so as to generate an error voltage which is used to set the output frequency of the microwave generating voltage controlled oscillator.

*Background of the invention*

The basic phase locked digital synthesizer using a variable counter or divider, phase detector and voltage controlled oscillator to generate coherent frequencies is well known. Briefly this type of frequency synthesizer utilizes the voltage controlled oscillator to generate the desired coherent output frequency in response to the phase detector output signal. The output frequency is fed back to the phase detector through a variable divider to be compared with a reference frequency generated by a stable frequency reference. The output frequency is therefore equal to the reference frequency times the count of the divider. The desired frequency may be varied by varying the count of the divider. In a digital system the divider will consist of a number of binaries so that the divider count is always a whole number. It can thus be understood that only a single output frequency can be generated at any one time, and the possible frequencies which can be generated will be separated by an amount equal to the frequency reference. Theoretically such a system can be made to cover an arbitrary range or frequency band. However, since the output frequency is applied directly to the counter the output frequency of a basic phase locked digital synthesizer is limited by the speed of digital counting circuits. It is well known in the art that frequency division of microwave frequencies cannot be accomplished with digital counting circuits, since present instruments can only count cycle by cycle up to about 400 megahertz. One solution to this problem has been to heterodyne the microwave frequency feedback signal to a frequency range which can be processed by the counter. This type of system has some practical limitation. For example, as the output microwave frequency approaches the heterodyning frequency the heterodyne difference output approaches zero or may even become negative, thereby preventing lock up of the loop. Since digital counting circuits are easy to make, compact in size, and versatile in application, it is advantageous to determine additional methods of synthesizing microwave frequencies using digital counting techniques where the digital circuits are used within their operating range.

*Summary of the invention*

Accordingly a digitally controlled multichannel frequency synthesizer employing the basic principles of the phase locked digital synthesizer with a variable counter or divider has been devised wherein the dividers operate within their present frequency capabilities. Briefly, two feedback frequencies are offset and related to one another and additionally, are related to the desired output frequency. Each of these feedback frequencies is substantially lower than the microwave output frequency being in a range of frequencies which can be processed by digital dividers. The aforementioned frequency offset between the two feedback frequencies can therefore be provided by tying these frequencies together through digital counters of slightly different count. A third feedback frequency consisting of the heterodyned difference of the microwave output frequency and a selected harmonic of one of the feedback frequencies is compared with a reference frequency to generate a control signal which is applied to a variable frequency oscillator which generates the microwave output frequency in response to this control signal.

It is an object of this invention, therefore, to provide a digitally controlled frequency synthesizer for generating frequencies in the microwave range.

It shall be a further object of this invention to provide a multichannel digitally controlled frequency synthesizer having a simple relationship between an output frequency and a reference frequency.

It shall be a further object of this invention to provide a multichannel digitally controlled frequency synthesizer for generating microwave frequencies which may be stepped through its various channels simply by varying a single parameter of the system.

Other objects and advantages of this invention will become apparent in the herein described embodiment in the appended claims.

The figure is a block diagram of a multichannel digitally controlled frequency synthesizer of the present invention.

*Description of the preferred embodiment*

A variable frequency oscillator 10, that is, an oscillator which has the property of being tuned in response to an external stimulus, generates an output microwave frequency $f_0$ in response to an error signal $V_1$. Oscillator 10 might be any oscillator known in the art which is capable of tuning over the desired range with adequate output power. Suitably, a voltage controlled microwave oscillator is used and, more specifically, a backward-wave oscillator because of its high output power, low noise and octave tuning range. Backward-wave oscillators are particularly adapted to use at microwave frequencies having been fabricated to generate frequencies as high as 100,000 mHz., while at the other extreme, convenient sized tubes have been produced for frequencies less than 200 mHz. Under practical conditions a backward-wave oscillator having a 2:1 frequency range with an error signal voltage range of 10:1 or less is possible. Other microwave tubes as well as transistor devices or tunnel diode oscillators would also be suitable over their reduced tuning ranges where the requirements of the synthesizer allow.

A second variable frequency oscillator 12, tuned to generate coherent frequencies over a range much below microwave range, generates a first feedback frequency $f_2$ in response to error signal $V_2$. Oscillator 12 is suitably a voltage controlled oscillator employing varactor diodes in a tank circuit to control its output frequency.

Frequency $f_2$ is applied to spectrum generator 13 which in response thereto generates an output signal consisting of harmonics of input frequency $f_2$. A simple device which is known in the art for producing well defined harmonics up to the 200th harmonic is the snap-off or step-recovery diode harmonic generator. Briefly, the snap-off diode is a diode which has been doped during manufacture in such a way as to restrict the minority carriers to a very narrow region in the immediate area of the junction. When, additionally, the junction barrier capacitance is made small, the storage phase of the diode as the forward-biased diode recovers to the reversed-biased condition as would occur when a reversing polarity signal is impressed across the diode, is very short since this storage phase is dependent only on the number of minority carriers in the neighborhood of the junction, which, as has been discussed, is quite small. This stage is followed by a transition stage during which the junction barrier capacitance is charged. Since the junction barrier capacitance is also very low, the diode can recover extremely rapidly with the result that very fast waveforms, rich in harmonics, are formed. The output of spectrum generator 13 is therefore equal to:

$$Af_2+Bf_2 \ . \ . \ . \ +Jf_2+Kf_2 \ . \ . \ .$$

where A, B, etc. are integers.

The aforementioned output frequency $f_0$ is combined in phase detector 15 with the output of spectrum generator 13. The output of detector 15 will consist of a D.C. term which is the result of combining $f_0$ with the $J^{th}$ harmonic of $f_2$, where $Jf_2=f_0$. Harmonics of $f_2$ of lower frequency than $f_0$ will produce a D.C. value equal to, but of opposite polarity from the D.C. term produced by harmonics of $f_2$ of higher frequency than $f_0$. The other harmonics of $f_2$, therefore, when combined with $f_0$, will produce an average D.C. value of zero. A diode ring demodulator has been found to be particularly efficient when used as phase detector 15, due to its inherent ability to operate at the high frequencies involved and its simple structure. Briefly, this type of phase detector utilizes a closed ring of four serially connected diodes having diametrically opposed terminals between diodes connected across the secondary of one input transformer, and the orthogonal terminals being connected across the secondary of a second input transformer. The signals whose phase are to be compared are applied: one to the primary winding of the first input transformer, the other signal to the primary winding of the second input transformer. The output is taken across center-tap terminals of the input transformer secondary windings. This type of phase detector is essentially a full wave rectifier type, wherein the rectified D.C. output of one input signal is referred to the rectified output of the other input signal to produce a D.C. voltage which is correlative to the phase difference between the two input frequencies. Filter 16 smooths out the D.C. term which is then applied as a control signal to oscillator 12. Since, as has been discussed, the only D.C. term applied to oscillator 12 is the product of $Jf_2$ with $f_0$, oscillator 12 will tune so as to generate frequency $f_2=f_0/J$. The significance of generating such a frequency will be shown later.

A third variable frequency oscillator 18, similar to oscillator 12 and tuned over the same approximate range, generates, in response to error signal $V_3$, a second feedback frequency $f_3$ which is divided by $N-1$ in variable counter 19. Counter 19 comprises a cascade of binaries which counts to $N-1$ where N is selectable and consists of a family of contiguous integers. Similarly, frequency $f_2$ is divided by N in counter 20 which is similar to and ganged to counter 19 so that the selectable integer N is identical in both counters. Additionally, counters 19 and 20 will include pulse shaping networks which, in the case of counter 19, will produce a sharp voltage transition every $N-1^{th}$ cycle of $f_3$, while counter 20 will produce a sharp voltage transition every $N^{th}$ cycle of $f_2$.

Although it is apparent that the output of counters 19 and 20 are not sinusoidal waveforms, but rather are sharp voltage transitions, the expressions $f_2/N$ and $f_3/N-1$ will be used to represent these voltage transitions and their time-phase relationships with the stated frequencies. In like manner, in various other parts of this description, terms containing stated frequency symbols will be used to indicate either sinusoidal waveforms or a series of pulses or voltage transitions which are representative of the time and phase relationship to the stated frequency. Generally, whether the expression used indicates pulses or sinusoidal waveforms will be clear from the description.

The outputs of counters 19 and 20 are applied to phase detector 21. Because of the relatively low frequency signals being applied to phase detector 21, it has been found to be advantageous to use a phase detector having relatively rapid signal acquisition property. Such a phase detector is the pulse and ramp type of phase detector, wherein the slope of a ramp voltage can be made quite steep so that large error signals are produced for small phase differences. Briefly, the pulse and ramp phase detector 21 includes pulse former 21–1 connected to counter 19 and pulse former 21–2 connected to counter 20. The output of counter 19, which, as has been stated, is a series of voltage transitions, is used by pulse former 21–1 to generate a narrow pulse which opens bilateral AND gate 21–3. Pulse former 21–2, however, is basically a ramp generator which is triggered by counter 20 output. This ramp is also applied to gate 21–3. During the interval that gate 21–3 is open, a voltage "sampled" from the ramp may pass therethrough into memory 21–4 which consists of a low-loss capacitor whose discharge path is blocked when the gate is closed. The input terminal or variable frequency oscillator 18 is connected to memory capacitor 21–4 through filter 22 which removes undesired AC components from the error signal $V_3$. The input terminal of oscillator 18, of course, must have a high input impedance to prevent bleed-off of the memory capacitor when gate 21–3 is closed. The variable frequency oscillator 18 input stage might, therefore, suitably include a field effect transistor with the output of memory 21–4 connected to the base of the aforementioned field effect transistor through filter 22.

When the loop consisting of variable frequency oscillator 18, counter 19, and phase detector 21 is locked, frequencies $f_2$ and $f_3$ are related through counters 19 and 20 as follows:

$$f_2/N=f_3/N-1$$

It is thus seen that $f_2$ and $f_3$ at phase lock, are close in value. In a practical circuit, N was made to assume values around 4000, while $f_2$ and $f_3$ were tunable in a range about 25 mHz. The frequencies $f_2/N$ and $f_3/N-1$ are therefore approximately 6.25 kHz. The ramp and gate phase detector described will operate efficiently within these frequencies and has the advantage of providing the loop a rapid acquisition time, since the slope of the ramp may be made quite steep so as to generate large D.C. error voltages for small values of phase difference. This is also especially important at low frequencies where the sampling rate is low.

Frequency $f_3$ is applied to spectrum generator 25 which is identical to spectrum generator 13. The output of generator 25 is therefore, similarly, harmonics of $f_3$ which are combined in mixer 26 with synthesizer output frequency $f_0$. Mixer output is filtered in low-pass filter 27 to remove all mixer products except the difference frequency of $f_0$ and the K$^{th}$ harmonic of $f_3$. Filter 27 output is therefore:

$$f_0 - Kf_3$$

A stable frequency reference 29, suitably a crystal controlled oscillator, generates a fixed reference frequency $f_1$ which is compared in phase detector 28 with filter 27 output. Of course, when the synthesizer is phase locked, reference frequency $f_1$ will be equal to filter 27 output frequency. It will be shown later, that at phase lock, synthesizer output frequency $f_0$ will be equal to $Nf_1$. Since in a practical synthesizer it is generally desired that the output frequency channels be closely spaced, reference frequency $f_1$ will be chosen to be a fairly low frequency. Thus, the frequencies being applied to phase detector 28 will be fairly low frequencies. A ramp and pulse detector, as used in phase detector 21, will therefore be used to advantage here also. The D.C. voltage output of phase detector 28 constitutes the aforementioned error signal $V_1$ which is applied to variable frequency oscillator 10 so as to tune it to generate synthesizer output frequency $f_0$.

It has thus been shown, that the digital circuits of this synthesizer are operating within the state of the art of digital counters. That is, the digital counters are counting cycle by cycle at frequencies well within the 400 mHz. limit of their capabilities. The relationships between the various frequencies generated by and within the synthesizer remains to be demonstrated.

In the above discussion the following frequency relationships have been shown. When the various loops are phased locked:

(1) $$f_0 = Jf_2$$

(2) $$f_3 = \frac{N-1}{N} f_2$$

(3) $$f_1 = f_0 - Kf_3$$

Combining Expressions 2 and 3 gives:

(4) $$f_0 - \frac{K(N-1)}{N} f_2 = f_1$$

and combining Expressions 1 and 4 and rearranging terms produces (5) $$f_0\left[\frac{J-K}{J} + \frac{K}{JN}\right] = f_1$$

If $J=K$, then the simple relation between $f_1$ and $f_0$ exists:

(6) $$f_0 = Nf_1$$

Additionally, as long as $J=K$, the absolute values thereof are immaterial.

It must now be shown that J can be made equal to K by a correct design of filter 27. The spectrum generated by generators 13 and 25 consists of the harmonics of frequencies $f_2$ and $f_3$ respectively. In essence, these spectra consist of lines separated by an amount equal to the spectrum generator exciting frequency. In the synthesizer presently described with $f_2$ and $f_3$, both approximately equal to 25 mHz., the spectral lines are separated by 25 mHz. Referring again to Expression 5

(5) $$f_0\left[\frac{J-K}{J} + \frac{K}{JN}\right] = f_1$$

and assuming that:

(7) $$J = K+1$$

substituting (7) in (5) produces (8) $$f_0\left[\frac{1}{K+1} - \frac{K}{(K+1)N}\right] = f_1$$

Again examining Expression 1

(1) $$f_0 = Jf_2$$

For a synthesizer output frequency of $f_0=4000$ mHz., $J=K+1=160$. Finding $\Delta f_1$, the frequency difference between spectral lines appearing at the input of filter 27, for $J=K$ and $J=K+1$ by subtracting (6) from (8) and simplifying $$\Delta f_1 = f_0\left[\frac{N-2K-1}{N(K+1)}\right] = 4000 \text{ mHz.} \left[\frac{4000-319}{4000(160)}\right] = 23.0 \text{ mHz.}$$

Thus we see that the spectral lines of signal entering filter 27 are spaced at 23 mHz. Additionally, from (1), (2) and (3)

(9) $$J = \frac{f_0}{f_2} = \frac{f_0}{f_3}\frac{N=1}{N}$$

(10) $$K = \frac{f_0 - f_1}{f_3}$$

so that

(11) $$\frac{J}{K} = \frac{N-1}{N}\frac{f_0}{f_0 - f_1}$$

In the system where $f_1 \ll f_0$, then

(12) $$\frac{J}{K} = \frac{N-1}{N} \approx 1$$

Again substituting values into (3)

$$f_1 = 4000 - 160\left[25\left(\frac{3999}{4000}\right)\right] \text{ mHz.} = 1.0 \text{ mHz.}$$

At phase lock, the frequency passed by filter 27 must be equal to $f_1$, thus filter 27 must be a low pass filter which will pass frequencies in the neighborhood of 1.0 mHz. Since, as has been shown, the next highest frequency entering filter 27 is approximately 24.0 mHz., filter 27 pass band can be quite broad without encountering the danger of passing ambiguous spectrum frequencies.

A strictly mathematical showing of the relationship between J and K indicated that J was approximately equal to K, the difference being one part in 4000 (see Expression 12). Of course, J and K can only assume integral values so that the broad pass band of filter 27 allows K to assume a value exactly equal to J at all times. Therefore $J=K$, and the relationship between a reference frequency and output frequency is $f_0=Nf_1$, where N is the count of a digital counter operating within its speed capabilities.

Certain alterations and modifications in this preferred embodiment of my invention will become apparent to one skilled in the art. Therefore, not wishing to limit my invention to the specific form shown, I hereby claim as my invention all the subject matter, including modifications and alterations thereof encompassed by the true scope and spirit of the appended claims.

The invention claimed is:

1. A digital frequency synthesizer comprising:

means responsive to a first error signal for generating a first frequency;

means responsive to a second error signal for generating a second frequency;

means responsive to a third error signal for generating a third frequency;

means responsive to said second and third frequencies for generating said third error signal;

means responsive to said second frequency for generating harmonics of said second frequency;

means responsive to said second frequency harmonics and said first frequency for generating said second error signal;

means responsive to said third frequency for generating harmonics of said third frequency;

means responsive to said third frequency harmonics and said first frequency for generating a complex frequency spectrum;

means responsive to said complex frequency spectrum for selecting a desired single frequency from said complex frequency spectrum;

a source of reference frequency; and means responsive to said reference frequency and said selected frequency for generating said first error signal.

2. A digital frequency synthesizer as recited in claim 1 wherein said means for generating said third error signal comprises:

a first frequency divider for dividing said second frequency;

a second frequency divider having a count slightly different from the count of said first frequency divider, for dividing said third frequency; and means responsive to said divided second frequency and said divided third frequency for generating said third error signal.

3. A digital frequency synthesizer as recited in claim 2 wherein said means for generating said third error signal comprises a ramp and pulse phase detector responsive to the phase difference between said divided second frequency and said divided third frequency.

4. A digital frequency synthesizer as recited in claim 2 wherein said first and second frequency dividers are digital, of variable count and ganged together.

5. A digital frequency synthesizer as recited in claim 4 wherein the count of said first divider differs from the count of said second divider by one.

6. A digital frequency synthesizer as recited in claim 1 wherein:

said means for generating a first frequency comprises a voltage controlled oscillator responsive to said first error signal; and said first error signal comprises an electrical signal.

7. A digital frequency synthesizer as recited in claim 6 wherein said means for generating a first frequency comprises a backward wave oscillator responsive to said first error signal.

8. A digital frequency synthesizer as recited in claim 1 wherein:

said means for generating a first frequency comprises a first variable frequency oscillator responsive to said first error signal;

said means for generating a second frequency comprises a second variable frequency oscillator responsive to said second error signal; and said means for generating a third frequency comprises a third variable frequency oscillator responsive to said third error signal.

9. A digital frequency synthesizer as recited in claim 8 wherein:

said means generating said first error signal comprises a first phase detector responsive to the phase difference of said reference frequency and said selected frequency;

said means generating said second error signal comprises a second phase detector responsive to the phase difference of said second frequency harmonics and said first frequency; and said means generating said third error signal comprises:

a first digital frequency divider of count N for dividing said second frequency;

a second digital frequency divider of count differing from the count of said first divider by one for dividing said third frequency; and a third phase detector responsive to said second and third divided frequencies for generating said third error signal.

10. A digital frequency synthesizer as recited in claim 9 wherein:

said first phase detector comprises a first pulse and ramp type phase detector responsive to the phase difference of said reference frequency and said selected frequency;

said second phase detector comprises a diode ring demodulator responsive to the phase difference of said second frequency harmonics and said first frequency; and said third phase detector comprises a second pulse and ramp type phase detector for generating said third error signal responsive to said second and third divided frequencies.

11. A digital frequency synthesizer as recited in claim 1 wherein said means for generating a complex frequency spectrum comprises a frequency mixer.

12. A digital frequency synthesizer as recited in claim 10 wherein:

said means for generating harmonics of said second frequency includes a first snap-off diode; and said means for generating harmonics of said third frequency includes a second snap-off diode.

13. A digital frequency synthesizer as recited in claim 12 wherein said means for selecting a desired single frequency from said complex frequency spectrum comprises a filter.

14. A digital frequency synthesizer as recited in claim 13 wherein said filter has a low pass band.

15. A digital frequency synthesizer as recited in claim 14 wherein said means for generating a complex frequency spectrum comprises a frequency mixer.

16. A digital frequency synthesizer as recited in claim 15 wherein said first frequency constitutes said synthesizer output frequency.

17. A digital frequency synthesizer as recited in claim 16 wherein:

said first digital frequency divider comprises a variable divider for dividing said second frequency; and said second digital frequency divider comprises a variable divider for dividing said third frequency and ganged to said first divider.

18. A digital frequency synthesizer as recited in claim 16 wherein:

said first digital frequency divider for dividing said second frequency comprises a first variable cascade of binaries; and said second digital frequency divider for dividing said third frequency comprises a second variable cascade of binaries ganged to said first frequency divider.

19. A digital frequency synthesizer comprising:

a first variable frequency oscillator responsive to a first error signal for generating a synthesizer output frequency;

a second variable frequency oscillator responsive to a second error signal for generating a second frequency;

a first spectrum generator responsive to said second frequency for generating harmonic frequencies of said frequency;

a first phase detector responsive to said synthesizer output frequency and said harmonic frequencies of said second frequency for generating said second error signal;

a third variable frequency oscillator responsive to a third error signal for generating a third frequency;

a first variable, digital frequency divider for dividing said second frequency;

a second variable, digital frequency divider, ganged to said first divider and having a count difference from the count of said first divider of one, for dividing said third frequency;

a second phase detector responsive to said second frequency divided and said third frequency divided for generating said third error signal;

a second frequency spectrum generator responsive to said third frequency for generating harmonics of said third frequency;

a mixer combining said harmonics of said third frequency with said synthesizer output frequency;

a low-pass filter connected to the output of said mixer for selecting a single desired frequency;

a source of reference frequency; and a third phase detector responsive to said selected single frequency and said reference frequency for generating said third error signal.

20. A digital frequency synthesizer as recited in claim 19 wherein:

said first variable frequency oscillator is tuned to generate microwave frequencies;

said second variable frequency oscillator is tuned to generate frequencies below microwave frequencies; and said third variable frequency oscillator is tuned to generate frequencies below microwave frequencies.

References Cited

UNITED STATES PATENTS 2,964,714 12/1960 Jakubowics ----------- 331—2

JOHN KOMINSKI, *Primary Examiner.*

U.S. Cl. X.R.

331—16, 25, 26, 53